(12) United States Patent
You et al.

(10) Patent No.: US 11,349,095 B2
(45) Date of Patent: May 31, 2022

(54) OPTICALLY CLEAR RESIN COMPOSITION AND DISPLAY DEVICE INCLUDING THE SAME

(71) Applicant: Samsung Display Co., Ltd., Yongin-si (KR)

(72) Inventors: Jong Sung You, Asan-si (KR); Yong Youl Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 210 days.

(21) Appl. No.: 16/566,963

(22) Filed: Sep. 11, 2019

(65) Prior Publication Data

US 2020/0006698 A1  Jan. 2, 2020

Related U.S. Application Data

(63) Continuation of application No. 14/801,013, filed on Jul. 16, 2015, now Pat. No. 10,446,788.

(30) Foreign Application Priority Data

Dec. 16, 2014  (KR) .................... 10-2014-0181417

(51) Int. Cl.
*H01L 51/52* (2006.01)
*C09J 133/08* (2006.01)
(Continued)

(52) U.S. Cl.
CPC ...... *H01L 51/5246* (2013.01); *C08G 18/8175* (2013.01); *C09J 4/00* (2013.01);
(Continued)

(58) Field of Classification Search
CPC ......... B32B 7/12; B32B 7/14; B32B 2457/20; B32B 2457/202; B32B 2457/204; B32B 2457/206; B32B 2457/208; C08G 18/8175; C09J 4/00; C09J 5/06; C09J 107/00; C09J 109/00; C09J 121/00; C09J 133/08;
(Continued)

(56) References Cited

U.S. PATENT DOCUMENTS 8,273,512 B2   9/2012  Tong et al.
8,492,969 B2   7/2013  Lee et al.
(Continued)

FOREIGN PATENT DOCUMENTS

CN   1703477   11/2005
CN   101615610  12/2009
(Continued)

OTHER PUBLICATIONS

Office Action dated Nov. 4, 2020 for Japanese Patent Application No. 2015-230973.
(Continued)

*Primary Examiner* — Eli D. Strah
(74) *Attorney, Agent, or Firm* — H.C. Park & Associates, PLC

(57) ABSTRACT

An optically transparent adhesive resin composition includes an ester polymer which contains an ester bond within a repeating unit, a (meth)acrylic ester polymer which contains a (meth)acrylic ester bond within the repeating unit, a rubber polymer, and a crystalline polymer.

10 Claims, 10 Drawing Sheets

(51) Int. Cl.
*C09J 175/14* (2006.01)
*C08G 18/81* (2006.01)
*C09J 4/00* (2006.01)
C09J 109/00 (2006.01)
C09J 107/00 (2006.01)
C09J 5/06 (2006.01)
B32B 7/12 (2006.01)
B32B 7/14 (2006.01)

(52) U.S. Cl.
CPC ........... *C09J 133/08* (2013.01); *C09J 175/14* (2013.01); *H01L 51/5275* (2013.01); *B32B 7/12* (2013.01); *B32B 7/14* (2013.01); *B32B 2457/20* (2013.01); *B32B 2457/202* (2013.01); *B32B 2457/204* (2013.01); *B32B 2457/206* (2013.01); *B32B 2457/208* (2013.01); *C09J 5/06* (2013.01); *C09J 107/00* (2013.01); *C09J 109/00* (2013.01); *C09J 2203/318* (2013.01); *C09K 2323/03* (2020.08); *C09K 2323/031* (2020.08); *C09K 2323/05* (2020.08); *H01L 2251/55* (2013.01)

(58) Field of Classification Search
CPC ...... C09J 167/00; C09J 175/14; C09J 201/00; C09J 2203/318; C09K 2323/03; C09K 2323/031; C09K 2323/05; G02B 5/30; G02F 1/1335; H01L 51/5246; H01L 51/5275; H01L 2251/55
See application file for complete search history.

(56) References Cited

U.S. PATENT DOCUMENTS

| 8,851,952 | B2 | 10/2014 | Lee et al. |
| 2004/0037990 | A1 | 2/2004 | Abe et al. |
| 2004/0175589 | A1 | 9/2004 | Rabasco et al. |
| 2009/0322214 | A1 | 12/2009 | Lee et al. |
| 2010/0097552 | A1 | 4/2010 | Shinya et al. |
| 2011/0201717 | A1 | 8/2011 | Held et al. |
| 2012/0100359 | A1 | 4/2012 | Kishioka et al. |
| 2013/0273266 | A1 | 10/2013 | Niiyama |

FOREIGN PATENT DOCUMENTS

| JP | 2009-79119 | | 4/2009 | |
| JP | 2009079119 | A * | 4/2009 | |
| JP | 2011-002828 | | 1/2011 | |
| JP | 2011511851 | | 4/2011 | |
| JP | 2012-006321 | | 1/2012 | |
| JP | 2012006321 | A * | 1/2012 | |
| JP | 2013056966 | | 3/2013 | |
| KR | 10-2004-0030389 | | 4/2004 | |
| KR | 10-2010-0001275 | | 1/2010 | |
| KR | 10-2011-0008761 | | 1/2011 | |
| KR | 10-2011-0076707 | | 7/2011 | |
| KR | 10-2011-0104400 | | 9/2011 | |
| KR | 10-1264809 | | 5/2013 | |
| WO | 2014029062 | | 2/2014 | |
| WO | WO-2014029062 | A1 * | 2/2014 | ........... B32B 43/006 |

OTHER PUBLICATIONS

Non-Final Office Action dated Jan. 5, 2018, issued in U.S. Appl. No. 14/801,013.
Final Office Action dated Apr. 20, 2018, issued in U.S. Appl. No. 14/801,013.
Non-Final Office Action dated Nov. 13, 2018, issued in U.S. Appl. No. 14/801,013.
Notice of Allowance dated Jun. 10, 2019, issued in U.S. Appl. No. 14/801,013.
Office Action dated Oct. 9, 2019, issued in Chinese Patent Application No. 201510824535.5.
Notice of Allowance dated Feb. 25, 2021, in Korean Patent Application No. 10-2014-0181417.

* cited by examiner

OPTICALLY CLEAR RESIN COMPOSITION AND DISPLAY DEVICE INCLUDING THE SAME

CROSS REFERENCE TO RELATED APPLICATION

This application is a Continuation of U.S. patent application Ser. No. 14/801,013, filed on Jul. 16, 2015, and claims priority from and the benefit of Korean Patent Application No. 10-2014-0181417, filed on Dec. 16, 2014 which is hereby incorporated by reference for all purposes as if fully set forth herein.

BACKGROUND

Field

Exemplary embodiments of the present invention relate to an optically transparent adhesive composition and a display device including the same.

Discussion of the Background

A display device is a device that visually displays data. In recent years, various flat display devices, such as a liquid crystal display (LCD), a plasma display panel (PDP) and an organic light emitting diode display (OLED) have been developed.

The display device typically includes a display panel for displaying an image, a cover window for protecting the display panel from external impact, a polarizing plate interposed between the display panel and the cover window, and an adhesive layer interposed between the polarizing plate and the cover window. The display device also typically includes a display area for displaying an image and a non-display area surrounding the display area.

Recently, as development of structures for reducing the width of the non-display area has progressed, an overlap area of the polarizing plate and the non-display area has been gradually decreasing in size.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide an optically transparent adhesive composition with improved elastic force and adhesive force.

Exemplary embodiments of present invention also provide a display device in which an air pocket is not visible.

Exemplary embodiments of present invention also provide a display device with improved reliability at high temperatures.

Additional features of the invention will be set forth in the description which follows, and in part will be apparent from the description, or may be learned by practice of the invention.

An exemplary embodiment of the present invention discloses an optically transparent adhesive resin composition, including an ester polymer which contains an ester bond within a repeating unit, a (meth)acrylic ester polymer which contains a (meth)acrylic ester bond within the repeating unit, a rubber polymer, and a crystalline polymer.

An exemplary embodiment of the present invention also discloses a display device including a cover window which includes a transparent area and an opaque area disposed outside the transparent area, a display panel which includes a display area and a peripheral area disposed outside the display area, a polarizing plate interposed between the display panel and the cover window and an optically transparent adhesive resin film which includes a crystalline polymer and covers the polarizing plate and the display panel.

An exemplary embodiment of the present invention also discloses a display device including a cover window which includes a transparent area and an opaque area disposed outside the transparent area, a display panel which includes a display area and a peripheral area disposed outside the display area, a polarizing plate interposed between the display panel and the cover window and an optically transparent adhesive resin film which includes a first area superimposed with the transparent area and a second area superimposed with the opaque area, the first area being different from the second area in crystallinity.

It is to be understood that both the foregoing general description and the following detailed description are exemplary and explanatory and are intended to provide further explanation of the claimed subject matte.

BRIEF DESCRIPTION OF THE DRAWINGS

The accompanying drawings, which are included to provide a further understanding of the inventive concept and are incorporated in and constitute a part of this specification, illustrate exemplary embodiments of the invention, and, together with the description, serve to explain the principles of the inventive concept.

DETAILED DESCRIPTION OF THE ILLUSTRATED EMBODIMENTS

Figure 1:
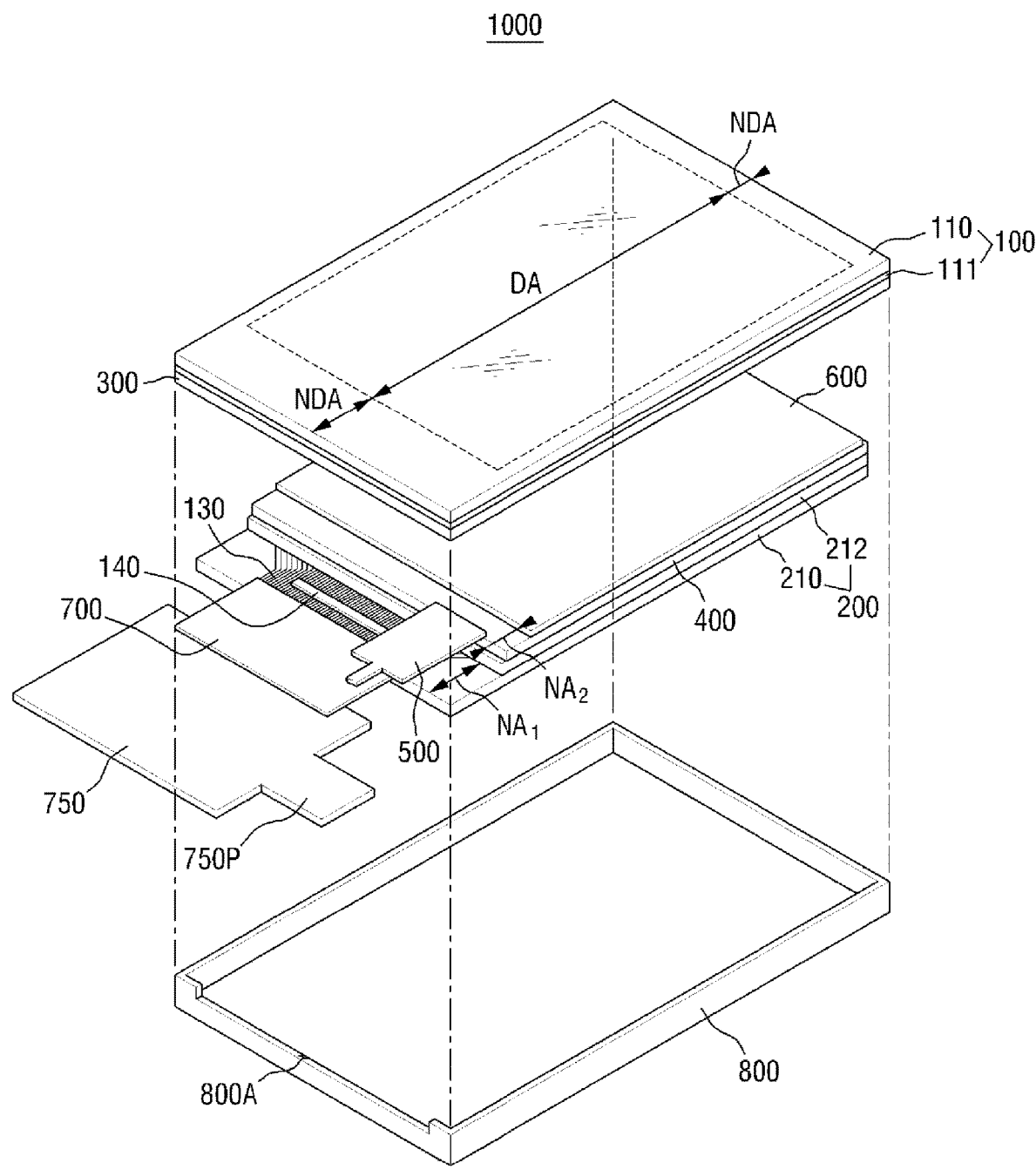
FIG. 1 is a schematic exploded perspective view of a display device according to an exemplary embodiment.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
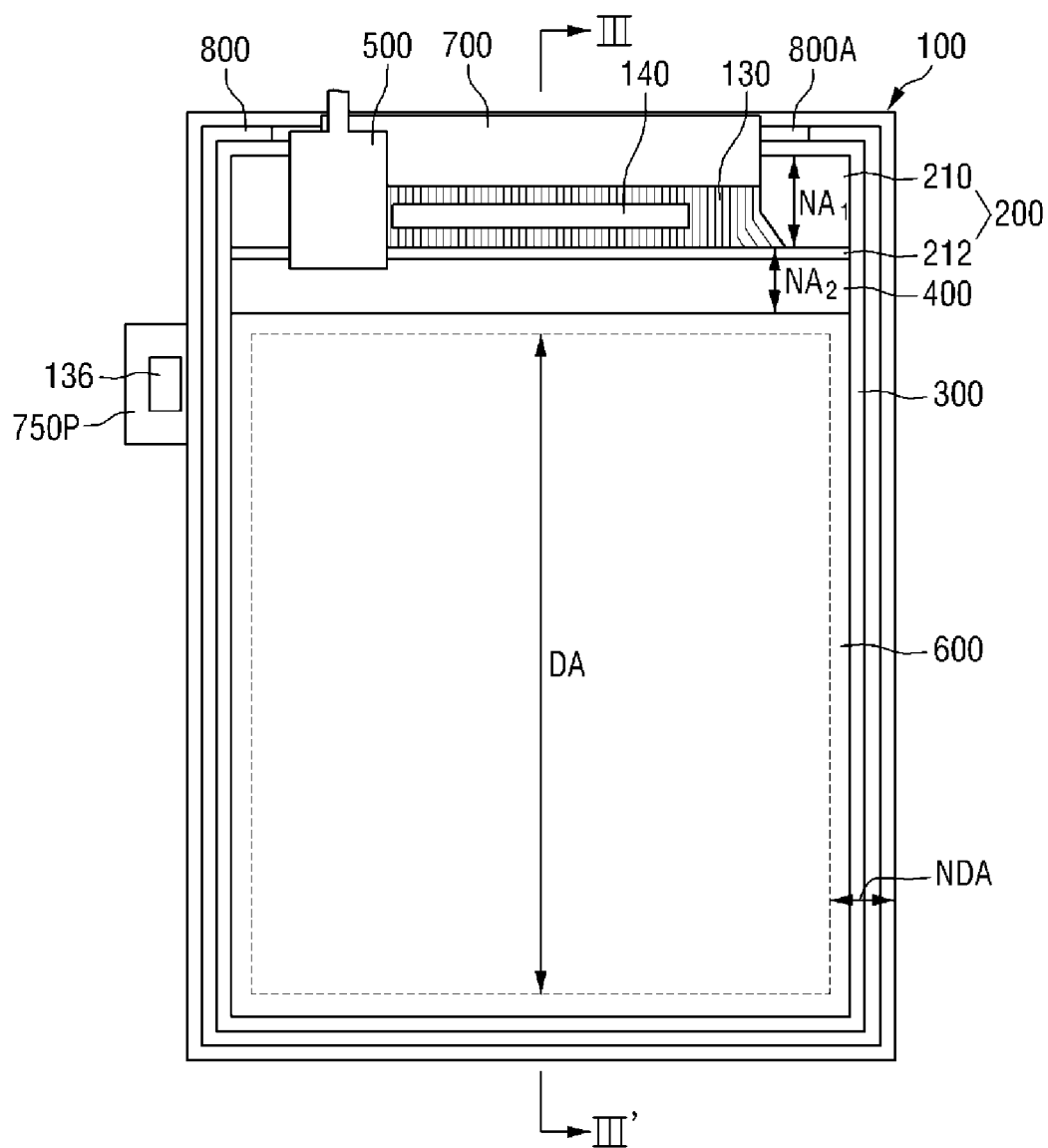
FIG. 2 is a schematic plan view illustrating an arrangement relation of respective constituent elements of the display device according to the exemplary embodiment shown in FIG. 1.
Figure 3:
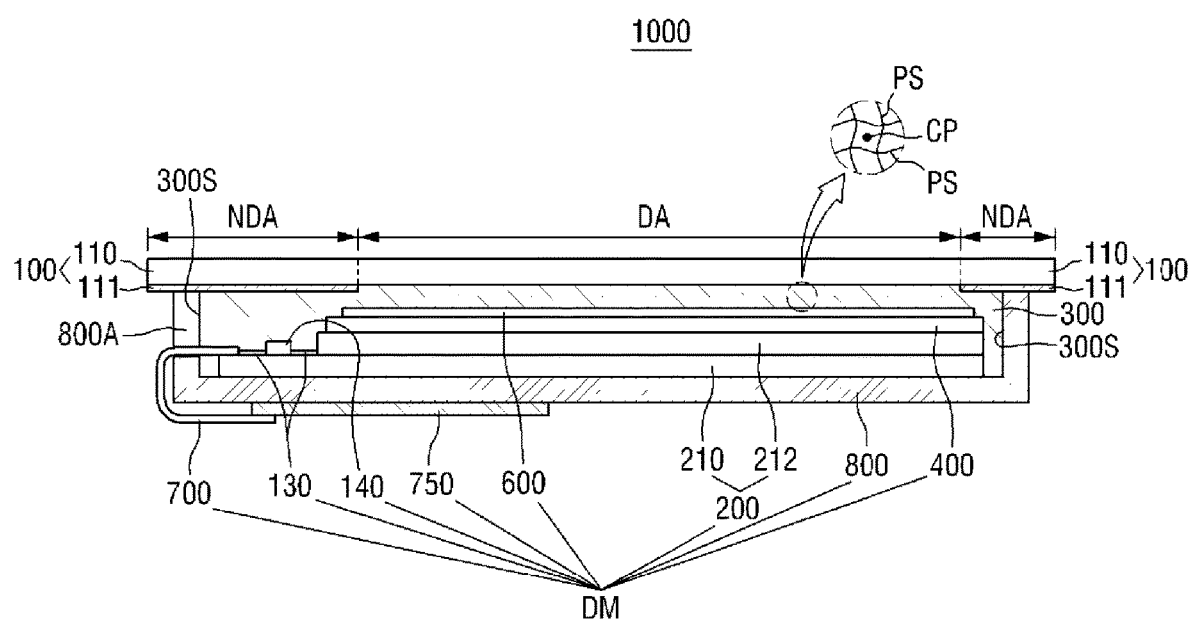
FIG. 3 is a schematic cross-sectional view taken along line of FIG. 2.

FIG. 1 is a schematic exploded perspective view of a display device 1000 according to an exemplary embodiment. FIG. 2 is a schematic plan view illustrating an arrangement relation of the respective constituent elements that form the display device 1000 according to exemplary embodiment shown in FIG. 1. In order to clarify the positional relation of the respective constituent elements that form the display device 1000, an opaque layer of FIG. 1 is omitted. FIG. 3 is a schematic cross-sectional view taken along the line of FIG. 2.

Referring to FIGS. 1 to 3, the display device 1000 can be configured to include a cover window 100, a metal wire 130, an integrated circuit (IC) chip 140, a display panel 200 for displaying an image, an optically transparent adhesive resin film 300, a touch screen panel 400, a touch screen circuit film 500, a polarizing plate 600, a flexible printed circuit board 700, a printed circuit board 750, a support member 800, and the like.

In the specification, with the exception of the optically transparent adhesive resin film 300, a structure, in which constituent elements of the display device 1000 disposed below the cover window 100 are laminated, will be defined as a display module DM. The constituent elements of the display device 1000 disposed below the cover window 100 may be the metal wire 130, the integrated circuit chip 140, the display panel 200, the touch screen panel 400, the polarizing plate 600, the flexible printed circuit board 700, the printed circuit board 750, the support member 800, and the like.

The display device 1000 is not particularly limited as long as it can visually convert data to display an image. An organic light emitting display device will be described below as an example of the display device 1000.

The cover window 100 may protect the display panel 200 against external impact. The cover window 100 may include a transparent substrate 110, and an opaque layer 111 disposed on one side of the transparent substrate 110. In a non-limiting example, the transparent substrate 110 may be a glass or a transparent resin. The opaque layer 111 may prevent the metal wire 130, the integrated circuit chip 140, the flexible printed circuit board 700, and/or the like mounted on the peripheral areas ($NA_1$, $NA_2$) of the display panel 200 from being externally visible. In a non-limiting example, the opaque layer 111 may be a colored print layer, and specifically, it may be a black ink print layer printed with black ink.

The cover window 100 may include a transparent area DA, and an opaque area NDA disposed outside the transparent area DA. Images generated from the display panel 200 are externally visible through the transparent area DA. The opaque area NDA is formed by the opaque layer 111, and images generated from the display panel 200 are not externally visible through the opaque area NDA. The opaque layer 111 may be in direct contact with the side walls of the support member 800.

The opaque area NDA is superimposed to overlap with the peripheral areas ($NA_1$, $NA_2$) of the display panel 200, and the transparent area DA superimposed to overlap the display area of the display panel 200.

The display panel 200 may be an organic light emitting display panel. The display panel 200 may include a first display board 210 and a second display panel 212. In a non-limiting example, the first display board 210 may be a thin film transistor substrate, and the second display panel 212 may be a sealing substrate that prevents the inflow of water or moisture. The second display panel 212 may have a smaller size or area than that of the first display board 210.

The peripheral areas ($NA_1$, $NA_2$) are areas in which the first display board 210 and the second display panel 212 are not superimposed to overlap with each other and the constituent elements of the display device 1000, such as the metal wire 130 and the integrated circuit chip 140, for transmitting a drive signal to pixels (not illustrated) disposed within the display area are mounted.

The metal wire 130 may be connected to a plurality of scanning lines or a plurality of signal lines. The metal wire 130 may electrically connect the first display board 210 and the flexible printed circuit board 700 through the integrated circuit chip 140. The integrated circuit chip 140 may be mounted on the first peripheral area $NA_1$ in a chip-on-glass (COG) manner, but is not limited thereto.

The touch screen panel 400 may be disposed between the cover window 100 and the second display panel 212. The touch screen circuit film 500 may be electrically connected to an electrode (not illustrated) of the touch screen panel 400. The touch screen circuit film 500 may be installed in the touch screen panel 400 in an area superimposed to overlap with the second peripheral area $NA_2$. The touch screen panel 400 and the touch screen circuit film 500 can be omitted.

The polarizing plate 600 may be disposed between the cover window 100 and the touch screen panel 400. The polarizing plate 600 may suppress reflection of external light. The polarizing plate 600 may cover the entirety of one side of the touch screen panel 400. A part of the polarizing plate 600 may be disposed in an area superimposed to overlap with the opaque area NDA of the cover window 100.

The flexible printed circuit board 700 may electrically connect the printed circuit board 750 to the display panel 200. The flexible printed circuit board 700 is bent to the lower side of the first display board 210 to hold the printed circuit board 750 below the first display board 210. The printed circuit board 750 may include electronic devices (not illustrated) for processing the drive signal, etc., and a connector 136 for receiving the transmission of the external signal. The printed circuit board 750 may include a protrusion 750P, and the connector 136 may be formed on the protrusion 750P.

The support member 800 may hold and support the display panel 200. The first display board 210 may be disposed inside the support member 800. The support member 800 may have a box shape having an opening 800A formed in the side wall. The flexible printed circuit board 700 may be exposed to the outside through the opening 800A. The support member 800 may be, but not limited to, stainless steel, aluminum, aluminum alloy having high rigidity or the like.

The optically transparent adhesive resin film 300 is disposed below the cover window 100. The optically transparent adhesive resin film 300 is disposed between the cover window 100 and the display module DM. The optically transparent adhesive resin film 300 fills a space between the cover window 100 and the display module DM. The optically transparent adhesive resin film 300 may join the cover window 100 and the display module DM together.

In a non-limiting example, the optically transparent adhesive resin film 300 may be formed through the following process. The optically transparent adhesive resin composition may be applied to one side of the cover window 100. The one side of the cover window 100, on which the optically transparent adhesive resin composition is applied, is positioned to face the one side of the display module DM. Thereafter, the optically transparent adhesive resin composition is cured by being irradiated with ultraviolet (UV) rays.

The optically transparent adhesive resin film 300 may be joined to one side of the transparent substrate 110 within the transparent area DA and may be joined to the opaque layer 111 within the opaque area NDA. The optically transparent adhesive resin film 300 may cover the peripheral areas ($NA_1$, $NA_2$) of the display panel 200. In other words, the metal wire 130, the touch screen panel 400, and the touch screen circuit film 500 may be covered with the optically transparent adhesive resin film 300. The optically transparent adhesive resin film 300 may cover the polarizing plate 600.

The optically transparent adhesive resin film 300 may contain a crystalline polymer. The crystalline polymer may improve the elastic force of the optically transparent adhesive resin film 300.

The crystalline polymer may include a semi-crystalline polymer. Amorphous polymer is made up of an amorphous area in which the polymer chains (PS) are not regularly arranged. Unlike the amorphous polymer, the crystalline area (CP), in which the polymer chains (PS) are regularly arranged, is present in the crystalline polymer.

The crystalline polymer has a melting point (m.p.) and a crystallization temperature, unlike the amorphous polymer. The melting point (m.p.) is a temperature at which the regularly arranged state of the polymer chains (PS) of the crystalline area (CP) becomes scattered, and the crystallization temperature is a temperature at which a formation rate of the crystalline area (CP) is maximized.

The crystalline polymer differs from the amorphous polymer in that the amorphous polymer has only a glass transition temperature (Tg). On the other hand, the crystalline polymer has all the glass transition temperature (Tg), the crystallization temperature (Tc) and the melting point (m.p.). This will be described in detail with reference to FIG. 4.

Figure 4:
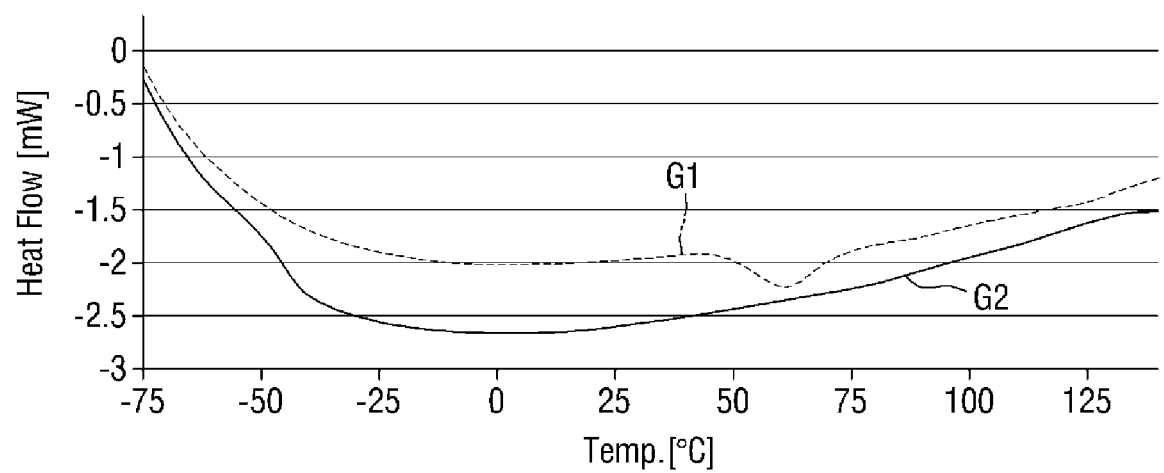
FIG. 4 is a relational graph between a temperature and a heat flow of each of crystalline polymer and rubber polymer used for the optically transparent adhesive resin composition that forms the optically transparent adhesive resin film according to the exemplary embodiment shown in FIG. 3.

FIG. 4 is a relational graph between temperature and heat flow. The results were gathered as a result of differential scanning calorimetry (DSC) of each of the crystalline polymer and the rubber polymer used in the optically transparent adhesive resin composition that forms the optically transparent adhesive resin film 300 of FIG. 3.

With reference to FIG. 4, a horizontal axis represents the temperature (° C.), and a vertical axis represents the heat flow (mW). The first graph (G1) is an endothermic curve of the crystalline polymer, and the second graph (G2) is an endothermic curve of the rubber polymer.

With reference to the first graph (G1), an endothermic peak is observed in the vicinity of about 60° C. Therefore, it is possible to know that the endothermic amount has rapidly increased in the vicinity of about 60° C. With reference to the second graph (G2), although a slight change in heat flow is observed in the vicinity of about −50° C., the same endothermic peaks as in the first graph (G1) is not observed.

From the experimental results, it can be concluded that the crystalline polymer is a compound having a melting point in the vicinity of about 60° C. Further, it can also be concluded that the rubber polymer is a compound having a glass transition temperature (Tg) in the vicinity of about −50° C. Thus, it can be concluded that the rubber polymer is an amorphous polymer.

Inter-molecular forces are present between the crystalline area (CP) and the polymer chains (PS). As an example, inter-molecular forces present between the crystalline area (CP) and the polymer chain (PS) may be van der Waals forces. It is understood that the optically transparent adhesive resin film 300 has the improved adhesive force and elastic force because of the van der Waals forces acting between the crystalline area (CP) and the polymer chains (PS). This will be described in detail below with reference to FIGS. 5 and 6 and Table 1.

In a non-limiting example, the crystalline polymer may be polypropylene, syndiotatic polystyrene, polyamide, polycaprolactone, polycarbonate-diol, polyethylene terephthalate (PET), polyphenylene sulfide, polybutylene terephthalate (PBT), polyarylate (PAR), poly(N,N-diphenylacrylamide) (poly(DPAA)), polyether imide (PEI), polyacetal, polyoxymethylene (POM), and/or the like.

The crystalline polymer may have a melting point in the range between 40° C. and 100° C. The crystalline polymer may also be a crystalline substance at room temperature (from 20° C. to 25° C.).

The optically transparent adhesive resin film 300 may further include a rubber polymer. The rubber polymer may provide elastic force to the optically transparent adhesive resin film 300.

The rubber polymer may be an amorphous polymer that may have excellent elastic force and extensibility by free movement of the irregularly arranged polymer chains. Although the rubber polymer is not particularly limited, in a non-limiting example, the rubber polymer may be polybutadiene, polyisoprene, polyneoprene, polyisobutylene, cellulose acetate, polyvinyl acetate, or copolymers thereof.

The weight ratio of the crystalline polymer and the rubber polymer may be in the range of 1:0.3 to 1:1.5. The weight ratio of the crystalline polymer and the rubber polymer may be in the range of 1:0.5 to 1:1.2. For example, the weight ratio of the crystalline polymer and the rubber polymer may be 1:1.

The crystalline polymer may be a compound having a molecular weight in the range of 4000 to 6000. The crystalline polymer may have the improved adhesive force and the improved elastic force within the above-described molecular weight range. Moreover, the crystalline polymer may be dissolved within the above-described molecular weight range.

The rubber polymer may be a compound having a molecular weight in the range of 2000 to 6000. The rubber polymer may provide improved elastic force within the above-mentioned molecular weight range. Also, the rubber polymer may be dissolved within the above-mentioned molecular weight range.

The optically transparent adhesive resin film 300 may further include an ester polymer. The ester polymer may provide rigidity to the optically transparent adhesive resin film 300.

The ester polymer may be a polymer containing an ester bond within a first repeating unit of the ester polymer. For example, the ester polymer may be a carbamic acid ester polymer. Specifically, the carbamic acid ester polymer may be a urethane acrylate oligomer.

The ester polymer may be a compound having a molecular weight in the range of 3000 to 6000. The ester polymer may provide rigidity within the above-mentioned molecular weight range.

The optically transparent adhesive resin film 300 may further include a (meth)acrylic ester polymer. The (meth)acrylic ester polymer may affect the viscosity of the optically transparent adhesive resin film 300.

The (meth)acrylic ester polymer is a polymer containing a (meth)acrylic ester bond within a second repeating unit of the (meth)acrylic ester polymer. In a non-limiting example, the (meth)acrylic ester polymer may be photopolymer of (meth)acrylate monomers or photopolymerized copolymers, including methyl (meth)acrylate, ethyl (meth)acrylate, isopropyl (meth)acrylate, butyl (meth)acrylate, iso-butyl (meth)acrylate, t-butyl (meth)acrylate, iso-octyl (meth)acrylate, neopentyl (meth)acrylate, 2-ethyl hexyl (meth)acrylate, lauryl (meth)acrylate, iso-bornyl (meth)acrylate, tetrahydrofurfuryl (meth)acrylate, cyclohexyl (meth)acrylate, 2-hydroxyehtyl (meth)acrylate, and 4-hydroxybutyl (meth)acrylate.

A photoinitiator may generate radicals by light irradiation to initiate the photopolymerization reaction. The photoinitiator may be a short-wavelength initiator, a long-wavelength initiator, or a mixture thereof. Although the photoinitiator is not particularly limited, as an example, a benzoin-based initiator, a hydroxyketone-based initiator, an aminoketone-based initiator, a phosphine oxide-based initiator, or the like can be used.

More specifically, the photoinitiator may be, but not limited to, benzoin, benzoin methylether, benzoin ethylether, benzoin isopropylether, benzoin n-butylether, benzoin isobutylether, acetophenone, dimethylanino, acetophenone, 2,2-dimethoxy-2-phenyl acetophenone, 2,2-diethoxy-2-phenyl acetophenone, 2-hydroxy-2-methyl-1-phenylpropane-1-one, 1-hydroxycyclohexyl phenylketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4'-diethylamino benzophenone, dichlorobenzophenone, 2-methylanthraquinone, 2-ethylanthraquinone, 2-t-butylanthraquinone, 2-aminoanthraquinone, 2-methyl thioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylaminobenzoicacid ester, oligo[2-hydroxy-2-methyl-1-[4-(1-methylvinyl)phenyl] propanone], 2,4,6-trimethyl benzoyl-diphenyl-phosphine oxide, and/or the like.

The content of the ester polymer may be in the range of 20 wt % to 40 wt % based on the total weight of the polymer, the content of (meth)acrylic ester polymer may be in the range of 10 wt % to 35 wt % based on the total weight of the polymer, the content of rubber polymer may be in the range of 14 wt % to 35 wt % based on the total weight of the polymer, and the content of crystalline polymer may be in the range of 4 wt % to 53 wt % based on the total weight of the polymer.

When the ester polymer, the (meth)acrylic ester polymer, the rubber polymer and the crystalline polymer are blended within the above-described range of content, respectively, the optically transparent adhesive resin film 300 may provide viscosity for the process and can have improved rigidity, elastic force, and adhesive force that may resist external forces.

The optically transparent adhesive resin film 300 may further include an additive and a photoinitiator. Since the photoinitiator has been described above, the additive will be described below.

The additive may be included within the range of 1 part by weight to 10 parts by weight based the total weight of the polymer. When the total weight of the optically transparent adhesive resin composition is 100 parts by weight, the photoinitiator may be included within the range of 1 part by weight to 10 parts by weight.

In a non-limiting example, the additive may be a coupling agent, an adhesion enhancer, a yellowing inhibitor, an antioxidant, or the like.

The coupling agent may improve the interfacial adhesion of polymer and glass and/or carbon fibers. Also, the coupling agent may improve the adhesion reliability when the adhesive is left for a prolonged period of time at high temperature or in high humidity conditions.

In a non-limiting example, silane-based coupling agent, titanate-based coupling agent, chromium-based coupling agent, or the like may be used as the coupling agent. In a non-limiting example, the silane coupling agent may be γ-glycidoxypropyl triethoxy silane, γ-glycidoxypropyltrimethoxy silane, γ-glycidoxypropyl methyldiethoxy silane, γ-glycidoxypropyl triethoxy silane, 3-mercaptopropyl trimethoxy silane, vinyl trimethoxysilane, vinyltriethoxy silane, γ-methacryloxypropyl trimethoxy silane, γ-methacryloxy propyl triethoxy silane, γ-aminopropyl trimethoxy silane, γ-aminopropyl triethoxy silane, 3-isocyanato propyl triethoxy silane, γ-acetoacetatepropyl trimethoxysilane, γ-acetoacetatepropyl triethoxy silane, β-cyanoacetyl trimethoxy silane, β-cyanoacetyl triethoxy silane, acetoxyacetotrimethoxy silane, and/or the like.

The adhesion enhancer may improve the adhesive performance of the optically transparent adhesive resin film 300. Although the adhesion enhancer is not particularly limited, it may be rosin resin, rosin ester resin, terpene phenol resin, terpene resin, and/or the like.

The yellowing inhibitor may prevent the yellowing of the optically transparent adhesive resin film 300. In a non-limiting example, the yellowing inhibitor may be 3-(2H-benzotriazol-2-yl)-5-(1,1-dimethylethyl)4-linear or branched alkyl ester of 7-9 carbon number of hydroxybenzene propanoic acid, 2-(benzotriazol-2-yl)-4-(2,4,4-trimethyl-2-yl)phenol, 2-(2'-hydroxy-5'-methylphenyl) benzotriazol, 2-[2'-hydroxy-3',5'-bis(α,α-dimethylbenzyl)phenyl] benzotriazole, 2-(2'-hydroxy-3',5'-di-t-butylphenyl) benzotriazole, 2,4-hydroxybenzophenone, 2,4-hydroxy-4-methoxybenzophenone, 2,4-hydroxy-4-methoxybenzophenone-5-sulfonic acid, 2,4-diphenyl-6-(2-hydroxy-4-methoxyphenyl)-1,3,5-triazine, 2,4-diphenyl-6-(2-hydroxy-4-ethoxyphenyl)-1,3,5-triazine, 2,4-diphenyl-6-(2-hydroxy-4-propoxyphenyl)-1,3,5-triazine, 2,4-diphenyl-6-(2-hydroxy-4-butoxyphenyl)-1,3,5-triazine and/or the like.

Figure 5:
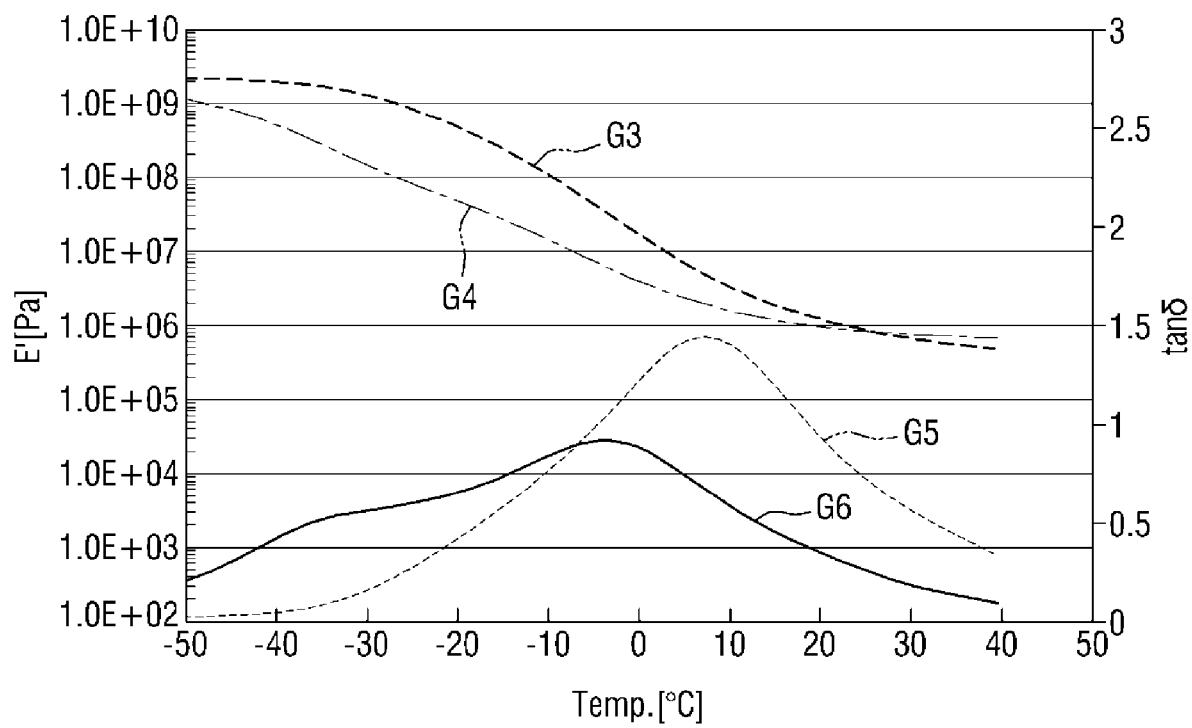
FIG. 5 is a relational graph between temperature and tensile storage modulus (E') or temperature and loss factor (tan δ) of the optically transparent adhesive resin composition that forms the optically transparent adhesive according to the exemplary embodiment shown in FIG. 3.

The optically transparent adhesive resin film 300 may have a glass transition temperature (Tg) in the range of 4° C. to 10° C. FIG. 5 is a relational graph between temperature and tensile storage modulus (E') or between temperature and loss factor (tan δ). The results were gathered by dynamic mechanical analysis (DMA) of the optically transparent adhesive resin composition that forms the optically transparent adhesive resin film 300.

Experimental samples and comparative samples for the dynamic mechanical analysis (DMA) were fabricated through the following process. The glass transition temperatures of the fabricated samples and the comparative example were measured using the method of dynamic mechanical analysis (DMA) as follows.

<Fabrication of Experimental Samples>

30 g of a mixture of tetrahydrofurfuryl acrylate, isobornyl methacrylate, lauryl acrylate and n-octyl acrylate was charged into a 3-neck glass reaction vessel equipped with an anchor-type impeller, a thermometer, and a dropping funnel, and a nitrogen atmosphere was maintained.

30 g of urethane acrylate oligomer, 20 g of polyisoprene, and 20 g of polycaprolactone were added to the reactor at a temperature between 45° C. and 50° C. Then, 3 g of a photoinitiator (described above) was slowly added while stirring the mixture.

When the photoinitiator had dissociated after stirring the mixture for 1 hour, the mixture was stirred while further adding the additive and the silane coupling agent.

<Fabrication of Comparative Sample>

30 g of a mixture of tetrahydrofurfuryl acrylate, isobornyl methacrylate, lauryl acrylate and n-octyl acrylate was charged into a 3-neck glass reaction vessel equipped with an anchor-type impeller, a thermometer, and a dropping funnel, and a nitrogen atmosphere was maintained.

30 g of urethane acrylate oligomer and 40 g of polyisoprene were added to the reactor at a temperature between 45° C. and 50° C. 3 g of a photoinitiator (described above) was slowly added while stirring the mixture.

When the photoinitiator was dissociated after stirring the mixture for 1 hour, the mixture was stirred while further adding the additive and the silane coupling agent.

With reference to FIG. 5, the horizontal axis represents the temperature, the left vertical axis represents the tensile storage modulus (E'), and the right vertical axis represents the loss factor (tan δ).

The third graph (G3) is a tensile storage modulus change curve depending on the temperature of the experimental sample, the fourth graph (G4) is a tensile storage modulus change curve depending on the temperature of the comparative sample. The fifth graph (G5) is a change curve of the loss factor (tan δ) depending on the temperature of the experimental samples, and the sixth graph (G6) is a change curve of the loss factor (tan δ) depending on the temperature of the comparative sample.

With reference to the third graph (G3), the tensile storage modulus value gradually decreases as the temperature increases. With reference to the fifth graph (G5), the value of the loss factor (tan δ) gradually decreases, after exhibiting the highest peak in the vicinity of about 7° C., while gradually increasing according to an increase in temperature.

With reference to the fourth graph (G4), it can be seen that the tensile storage modulus value gradually decreases as the temperature increases. With reference to the sixth graph (G6), it can be seen that the value of the loss factor (tan δ) gradually decreases, after exhibiting the highest peak in the vicinity of about −3° C., while gradually increasing according to an increase in temperature.

With reference to FIG. 5, it can be concluded that the experimental sample exhibits the glass transition temperature (Tg) in the vicinity of about 7° C., and the comparative sample exhibits the glass transition temperature (Tg) in the vicinity of about −3° C.

That is, the comparative sample including no polycaprolactone crystalline polymer exhibits the glass transition temperature (Tg) in the vicinity of about −3° C., and the experimental sample containing polycaprolactone exhibits the glass transition temperature (Tg) in the vicinity of about 7° C. This experimental result is a result of the physical properties of the experimental sample including crystalline area (CP) of polycaprolactone being different than the comparative sample not including crystalline area (CP) of polycaprolactone.

The optically transparent adhesive resin film 300 has an elastic modulus in the range of 0.17 Mpa to 0.25 Mpa.

Figure 6:
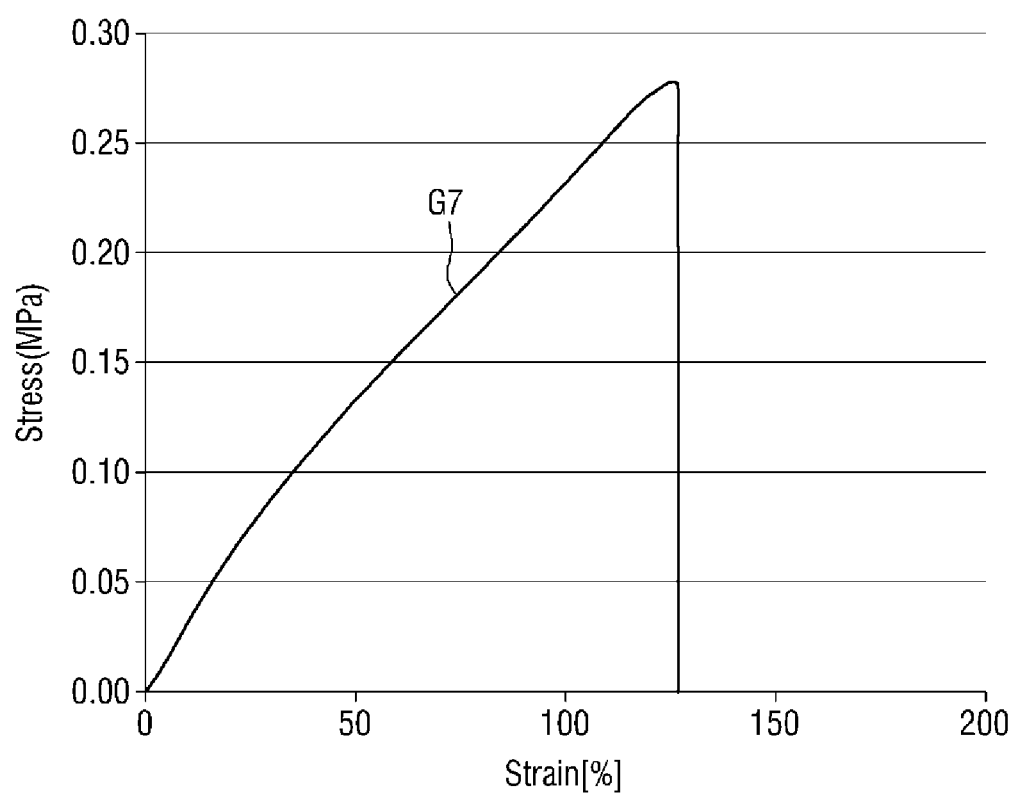
FIG. 6 is a relational graph between stress and strain of the optically transparent adhesive resin composition that forms the optically transparent adhesive resin film according to the exemplary embodiment shown in FIG. 3.

FIG. 6 is a relational graph between stress and strain of the optically transparent adhesive resin composition that forms the optically transparent adhesive resin film 300 of FIG. 3.

The elastic modulus of the experimental sample was measured using a universal testing machine. Specifically, after one end and the other end of the experiment sample having a length of 30 mm and a width of 10 mm was fixed by an upper jig and a lower jig, respectively, of the universal testing machine, it was pulled at a rate of 50 mm/min.

With reference to FIG. 6, a horizontal axis represents strain, and a vertical axis represents stress. Modulus can be measured by the slope of stress relative to strain. With reference to the seventh graph (G7), it can be concluded that that when strain is about 100%, stress is about 0.22 MPa.

The optically transparent adhesive resin film 300 has shear strength of 300 N/cm² or more at 25° C. and has shear strength of 65 N/cm² or more at 85° C.

The shear strength of the comparative sample and the experimental sample were measured using the universal testing machine. Specifically, after curing the experimental sample having thickness of 150 μm between the slide glasses spaced apart from each other, the slide glasses were moved in the vertically opposite directions at a rate of 5 mm/min, respectively. Similarly, after curing the comparative sample having the thickness of 150 μm between the slide glasses spaced apart from each other, the slide glasses were moved in the vertically opposite directions at a rate of 5 mm/min, respectively.

Table 1 shows the measurement results of the shear strength. With reference to Table 1, it can be concluded that the experimental sample has the improved shear strength when compared to the comparative sample.

TABLE 1

| temperature | comparative sample | experimental sample |
|---|---|---|
| 25° C. | 230 N/cm² | 322 N/cm² |
| 85° C. | 61 N/cm² | 70 N/cm² |

Figure 7:
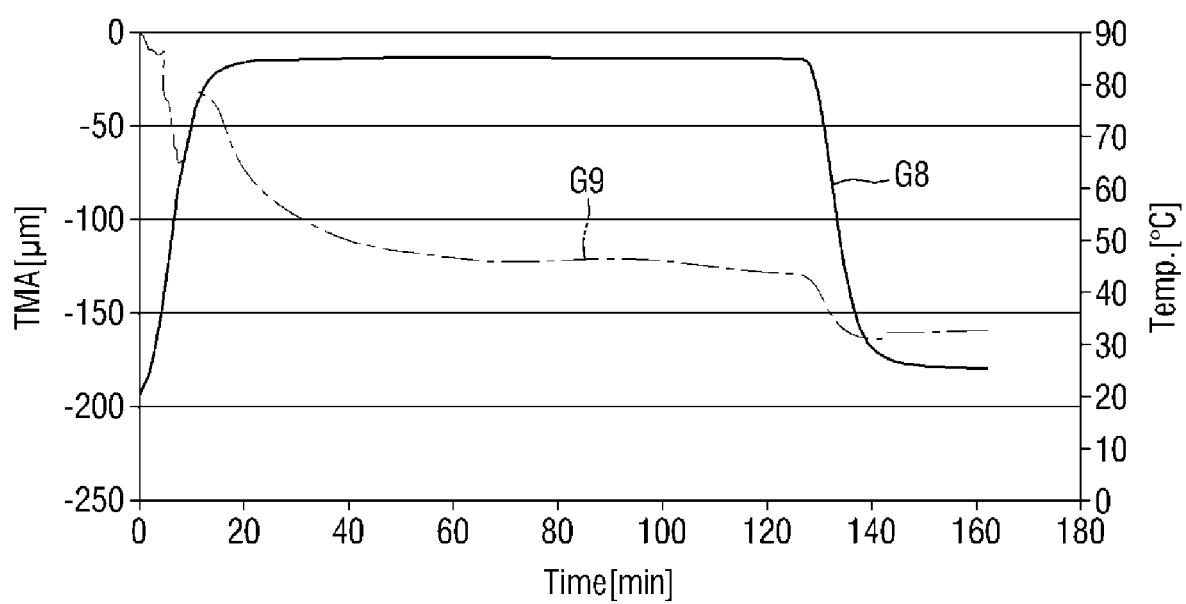
FIG. 7 is a graph concerning shrinkage according to time, as a result of thermomechanical analysis (TMA) of the polarizing plate used for the display device according to the exemplary embodiment shown in FIG. 3.

FIG. 7 is a graph showing shrinkage according to time. The results were determined by thermomechanical analysis (TMA) of the polarizing plate 600 used in the display device 1000 of FIG. 3.

The eighth graph (G8) is a graph illustrating the relation between the temperature (° C.) and time (min). With reference to the eighth graph (G8), it can be seen that after the temperature rises to about 85° C. for first 20 minutes, the temperature of about 85° C. was maintained for about 2 hours.

The ninth graph (G9) is a graph illustrating the relation between shrinkage (μm) of the polarizing plate 600 and time (min). With reference to the ninth graph (G9), it can be concluded that shrinkage occurs in the polarizing plate 600 at a temperature of about 85° C.

Figure 8:
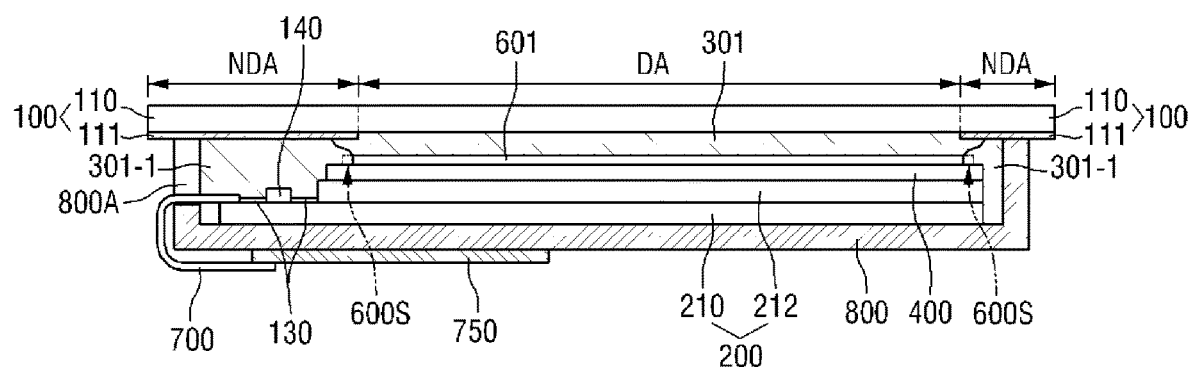
FIG. 8 is a schematic cross-sectional view of a display device according to another exemplary embodiment.

FIG. 8 is a schematic cross-sectional view of a display device 1001 according to another exemplary embodiment. With reference to FIG. 8, the display device 1001 is different from the display device 1000 of FIG. 3 in that shrinkage of a shrinkage area 600S occurs in a polarizing plate 601 in display device 1001 of FIG. 8.

The shrinkage force of the polarizing plate 601 induces a change in physical properties of the optically transparent adhesive resin film 300. With reference to FIG. 8, the optically transparent adhesive resin film 300 can be divided into a first area 301 and a second area 301-1.

In a non-limiting example, the first area 301 and the second area 301-1 may be different from each other in crystallinity. Crystallinity is a percentage of the weight of the crystalline area CP in the total weight of the whole crystalline polymer. The first area 301 can be an area superimposed to overlap the transparent area DA, and the second area 301-1 can be an area superimposed to overlap the opaque area.

As a method for measuring crystallinity, a density method in which additive properties from both densities of the crystalline area and the amorphous area are assumed, a method by measurement of heat of fusion, a X-ray method performed by separating the intensity distribution of the X-ray diffraction into diffraction due to the amorphous area and diffraction due to the crystalline area, or the like is used.

Crystallinity may vary due to the crystallization temperature, the cooling rate, external forces, or the like, and the adhesive force of the optically transparent adhesive resin film 300 may act in the opposite direction to the shrinkage force of the polarizing plate 601. As a result, the second area 301-1 can be pulled relative to the first area 301, and the first area 301 can shrink relative to the second area 301-1.

For example, a force acting in the opposite direction to the shrinkage force of the polarizing plate 601 may be an adhesive force between the optically transparent adhesive resin film 300 and the opaque layer 111, an adhesive force between the optically transparent adhesive resin film 300 and the metal wire 130, an adhesive force between the optically transparent adhesive resin film 300 and the display panel 200, and/or the like.

The elastic force of the optically transparent adhesive resin film 300 can withstand the shrinkage force of the polarizing plate 601. Thus, in the second area 301-1, the density of the crystalline area (CP in FIG. 3) may decrease. Shrinkage force of the polarizing plate 601 may be concentrated in the first area 301, and therefore, the first area 301 may have a greater density of the crystalline area (CP in FIG. 3) than the second area 301-1. In other words, the crystallinity of the first area 301 can be greater than that of the second area 301-1. When crystallinity high, the optically transparent adhesive resin composition has a high density. Thus, the first area 301 and the second area 301-1 are different from each other in density of the optically transparent adhesive resin composition.

Density differences in the optically transparent adhesive resin composition between the first area 301 and the second area 301-1 can induce differences in optical properties. In a non-limiting example, the first area 301 and the second area 301-1 may be different from each other in optical transmittance. Specifically, the first area 301 may have lesser optical transmittance than the second area 301-1.

In another non-limiting example, the first area 301 and the second area 301-1 may have different refractive indices. Specifically, the first area 301 may have a greater refractive index than the second area 301-1.

Figure 9:
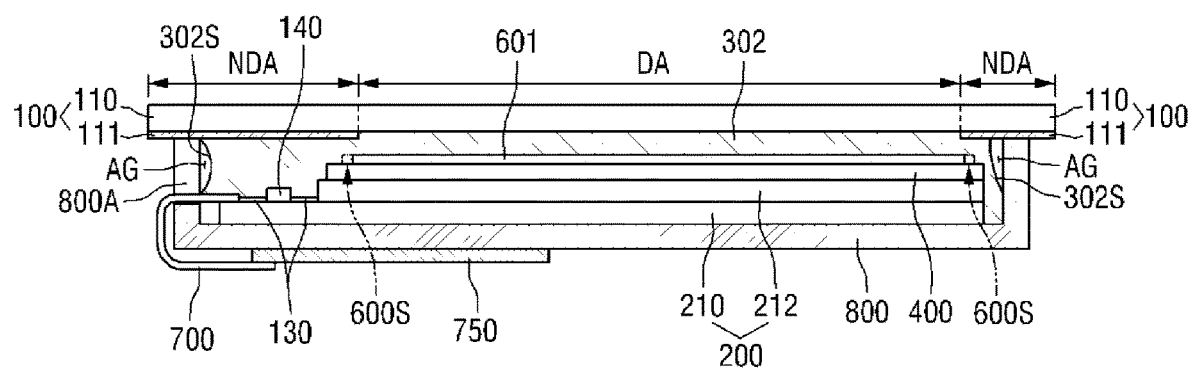
FIG. 9 is a schematic cross-sectional view of a display device according to a still another exemplary embodiment.

FIG. 9 is a schematic cross-sectional view of the display device 1002 according to still another exemplary embodiment of the present invention. The display device 1002 of FIG. 9 is different from the display device 1000 of FIG. 3 in that the display device 1002 includes the optically transparent adhesive resin film 302 having a bent lateral surface 302S.

With reference to FIG. 9, in the optically transparent adhesive resin film 302, air pocket (AG) can be generated in the second area (301-1 in FIG. 8) which is superimposed to overlap the opaque area NDA. The air pocket (AG) is not generated in the first area (301 in FIG. 8) which is superimposed to overlap the transparent area DA.

The lateral surface 302S of the optically transparent adhesive resin film 302 can be bent in the first area (301-1 in FIG. 8) side by shrinkage of the polarizing plate 601. The lateral surface 302S may be a curved surface recessed in the first area (301-1 in FIG. 8) side and may generate the air pocket (AG) between the side walls of the support member 800.

Figure 10:
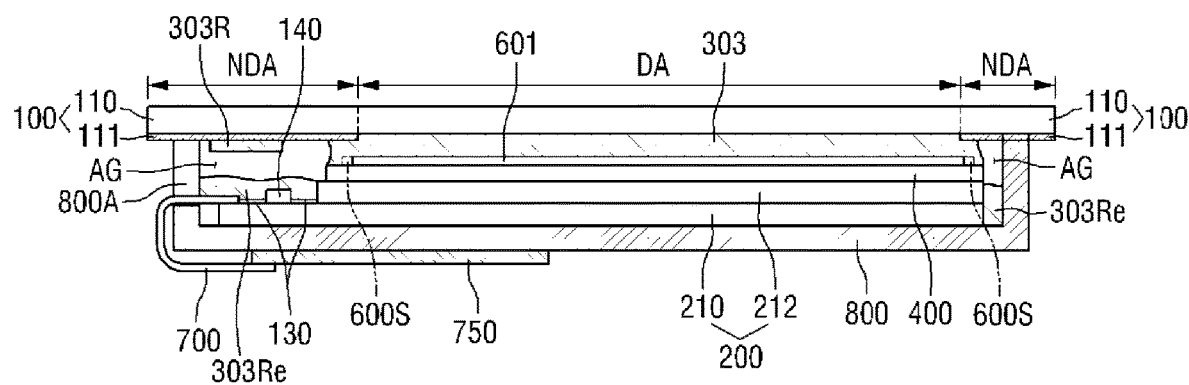
FIG. 10 is a schematic cross-sectional view of a display device according to still another fourth embodiment.

FIG. 10 is a schematic cross-sectional view of a display device 1003 according to still another exemplary embodiment of the present invention.

The display device 1003 of FIG. 10 is different from the display device 1002 of FIG. 9 in that a part of the optically adhesive resin film (see 302 in FIG. 9) is peeled off from the opaque layer 111 and is spatially separated to form the optically adhesive resin films (303, 303R, 303Re). In a non-limiting example, the optically adhesive resin film (see 302 in FIG. 9), which has failed to withstand the shrinkage force of the polarizing plate 601, can be peeled off from the opaque layer 111.

With reference to FIG. 10, the optically transparent adhesive resin film 303R joined to the opaque layer 111 may be spatially separated from the optically transparent adhesive resin film 303Re joined to the flexible printed circuit board 700, the metal wire 130 and the integrated circuit chip 140. The air pocket (AG) may be formed between the optically transparent adhesive resin film 303R and the optically transparent adhesive resin film 303Re. The air pockets (AG) may be also generated on the opaque layer 111, the optically transparent adhesive resin films (303, 303Re), and the side walls of the support member 800.

An optically transparent adhesive composition according exemplary embodiments of the present invention may have improved elastic force and adhesive force.

In a display device according to exemplary embodiments of the present invention, the air pocket may not be visible.

The display device according to exemplary embodiments of the present invention may have improved high-temperature reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An optically transparent adhesive resin composition, based on a total weight of the composition comprising:
   20 wt % to 40 wt % of an ester polymer comprising an ester bond within a first repeating unit of the ester polymer;
   10 wt % to 35 wt % of a (meth)acrylic ester polymer comprising a (meth)acrylic ester bond within a second repeating unit of the (meth)acrylic ester polymer;
   14 wt % to 35 wt % of a rubber polymer; and
   4 wt % to 53 wt % of a crystalline polymer,
   wherein a weight ratio of the rubber polymer and the crystalline polymer is in the range of 1:0.3 to 1:1.5, and
   wherein a film formed of the optically transparent adhesive resin composition has a shear strength greater than or equal to 65 N/cm$^2$ at 85° C.

2. The optically transparent adhesive resin composition of claim 1, wherein the crystalline polymer comprises at least one selected from the group consisting of polypropylene, syndiotatic polystyrene, polyamide, polycaprolactone, polycarbonate-diol, polyethylene terephthalate (PET), polyphenylene sulfide, polybutylene terephthalate (PBT), polyarylate (PAR), poly(N,N-diphenylacrylamide), polyether imide (PEI), polyacetal, and polyoxymethylene (POM).

3. A display device, comprising:
   a cover window comprising a transparent area and an opaque area disposed outside the transparent area;
   a display panel comprising a display area and a peripheral area disposed outside the display area;
   a polarizing plate interposed between the display panel and the cover window;
   and an optically transparent adhesive resin film comprising a first area superimposed to overlap the transparent area and a second area superimposed to overlap the opaque area, the first area being different from the second area in crystallinity,
   wherein the optically transparent adhesive resin film comprises a polymer composition that, based upon a total weight of the polymer composition, comprises: 20 wt % to 40 wt % of an ester polymer comprising an ester bond within a first repeating unit of the ester polymer, 10 wt % to 35 wt % of a (meth)acrylic ester polymer comprising a (meth)acrylic ester bond within a second repeating unit of the (meth)acrylic ester polymer, 14 wt % to 35 wt % of a rubber polymer, and 4 wt% to 53 wt % of a crystalline polymer,
   wherein a weight ratio of the rubber polymer and the crystalline polymer is in the range of 1:0.3 to 1:1.5, and
   wherein the optically transparent adhesive resin film has a shear strength greater than or equal to 65 N/cm$^2$ at 85° C.

4. The display device of claim 3, wherein the first area of the optically transparent adhesive resin film has different optical characteristics than the second area of the optically transparent adhesive resin film.

5. The display device of claim 4, wherein the first area of the optically transparent adhesive resin film has a different refractive index than the second area of the optically transparent adhesive resin film.

6. The display device of claim 4, wherein the first area of the optically transparent adhesive resin film has a different optical transmittance than the second area of the optically transparent adhesive resin film.

7. The display device of claim 3, wherein the optically transparent adhesive resin film is continuous in the first area of the optically transparent adhesive resin film.

8. The display device of claim 7, wherein an air pocket is present in the second area of the optically transparent adhesive resin film.

9. The display device of claim 3, wherein the second area of the optically transparent adhesive resin film comprises a curved surface that is recessed toward the first area of the optically transparent resin film.

10. An optically transparent adhesive resin composition, based on a total weight of the composition consisting of:
   20 wt % to 40 wt % of an ester polymer comprising an ester bond within a first repeating unit of the ester polymer;
   10 wt % to 35 wt % of a (meth)acrylic ester polymer comprising a (meth)acrylic ester bond within a second repeating unit of the (meth)acrylic ester polymer;
   14 wt % to 35 wt % of a rubber polymer; and
   4 wt % to 53 wt % of a crystalline polymer,
   wherein a weight ratio of the rubber polymer and the crystalline polymer is in the range of 1:0.3 to 1:1.5.

* * * * *